United States Patent
Lee et al.

(10) Patent No.: US 10,916,723 B2
(45) Date of Patent: Feb. 9, 2021

(54) ORGANIC LIGHT EMITTING DISPLAY DEVICE INCLUDING DISCHARGING HOLE

(71) Applicant: Samsung Display Co., LTD., Yongin-si (KR)

(72) Inventors: Junhee Lee, Hwaseong-si (KR); Sungmin Kim, Hwaseong-si (KR); Min Yeul Ryu, Suwon-si (KR); Woosik Jeon, Hwaseong-si (KR); Da-young Jung, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/591,142

(22) Filed: Oct. 2, 2019

(65) Prior Publication Data
US 2020/0136077 A1   Apr. 30, 2020

(30) Foreign Application Priority Data

Oct. 29, 2018 (KR) .................. 10-2018-0130054

(51) Int. Cl.
| H01L 29/08 | (2006.01) |
| H01L 51/50 | (2006.01) |
| H01L 51/52 | (2006.01) |
| H01L 51/56 | (2006.01) |
| H01L 51/00 | (2006.01) |

(52) U.S. Cl.
CPC ...... *H01L 51/5056* (2013.01); *H01L 51/0009* (2013.01); *H01L 51/5206* (2013.01); *H01L 51/5237* (2013.01); *H01L 51/56* (2013.01)

(58) Field of Classification Search
CPC ............ H01L 51/5056; H01L 51/5206; H01L 51/56; H01L 51/0009; H01L 51/5237; H01L 27/3258; H01L 51/525; H01L 51/5072; H01L 51/5225; H01L 27/3246
USPC .......................................................... 257/40
See application file for complete search history.

(56) References Cited

U.S. PATENT DOCUMENTS

| 10,332,919 | B2* | 6/2019 | Li ................... H01L 27/1244 |
| 2005/0258745 | A1* | 11/2005 | Tsujimura ........... H01L 27/3246 313/506 |
| 2010/0181559 | A1* | 7/2010 | Nakatani ............. H01L 27/3283 257/40 |
| 2013/0234126 | A1* | 9/2013 | Nakatani ............. H01L 27/3246 257/40 |

(Continued)

FOREIGN PATENT DOCUMENTS

| KR | 1020160023745 A | 3/2016 |
| KR | 1020170018235 A | 2/2017 |
| KR | 10-1831346 B1 | 2/2018 |

*Primary Examiner* — Caleb E Henry
(74) *Attorney, Agent, or Firm* — Cantor Colburn LLP

(57) ABSTRACT

An organic light emitting display device may include a base substrate including an emission area at which light is emitted and a peripheral area which is adjacent to the emission area; an encapsulation substrate disposed on the base substrate; a common layer between the base substrate and the encapsulation substrate, the common layer disposed in both the emission area and the peripheral area; between the base substrate and the common layer, each of: a planarization layer; a pixel electrode in the emission area; and a pixel defining layer; and a discharging hole disposed corresponding to the pixel defining layer, the discharging hole extending through the common layer.

11 Claims, 13 Drawing Sheets

(56) References Cited

U.S. PATENT DOCUMENTS

| | | | |
|---|---|---|---|
| 2015/0179099 A1* | 6/2015 | Go | H01L 51/525 345/206 |
| 2016/0079322 A1* | 3/2016 | Kim | H01L 51/0005 257/40 |
| 2018/0088293 A1 | 3/2018 | Toyonaka et al. | |
| 2018/0151646 A1* | 5/2018 | Kim | H01L 27/3262 |
| 2019/0013339 A1* | 1/2019 | Li | H01L 27/124 |
| 2019/0165068 A1* | 5/2019 | Park | H01L 51/5284 |
| 2019/0189717 A1* | 6/2019 | Choi | H01L 27/3246 |
| 2019/0207150 A1* | 7/2019 | Kwon | H01L 27/3246 |

* cited by examiner

ORGANIC LIGHT EMITTING DISPLAY DEVICE INCLUDING DISCHARGING HOLE

This application claims priority to Korean Patent Application No. 10-2018-0130054, filed on Oct. 29, 2018, and all the benefits accruing therefrom under 35 U.S.C. § 119, the entire disclosure of which is incorporated by reference herein.

BACKGROUND

1. Field

Embodiments relate to a display device. More particularly, embodiments relate to an organic light emitting display device and a method of manufacturing an organic light emitting display device.

2. Description of the Related Art

An organic light emitting display device may have an organic light emitting diode including a hole injection layer, an electron injection layer, and an organic light emitting layer formed therebetween. In the organic light emitting display device, light may be generated as excitons, which are the combination of holes injected from the hole injection layer and electrons injected from the electron injection layer, fall from an excited state to a ground state. The organic light emitting display device may not include a separate light source to generate light, and thus the organic light emitting display device may have relatively small thickness and light weight, as well as relatively low power consumption. Furthermore, the organic light emitting display device may have relatively wide viewing angle, high contrast and high response speed, etc.

The organic light emitting display device may include a planarization layer, a pixel defining layer, and a spacer. The planarization layer may protect a thin film transistor for driving the organic light emitting diode, and may provide a planarized surface thereon. The pixel defining layer may be provided on the planarization layer to divide pixels from each other. The spacer may be provided on the pixel defining layer to protect the organic light emitting diode from an encapsulation substrate. Each of the planarization layer, the pixel defining layer, and the spacer may include an organic layer including an organic material.

SUMMARY

Embodiments provide an organic light emitting display device in which pixel shrinkage due to gases discharged from an organic layer including an organic material is reduced or effectively prevented.

Embodiments provide a method of manufacturing an organic light emitting display device for reducing or effectively preventing pixel shrinkage thereof due to gases discharged from an organic layer including an organic material.

An organic light emitting display device includes a base substrate including an emission area at which light is emitted and a peripheral area which is adjacent to the emission area; an encapsulation substrate disposed on the base substrate; a common layer between the base substrate and the encapsulation substrate, the common layer disposed in both the emission area and the peripheral area; between the base substrate and the common layer, each of: a planarization layer; a pixel electrode in the emission area; and a pixel defining layer; and a discharging hole disposed corresponding to the pixel defining layer, the discharging hole extending through the common layer.

In an embodiment, the organic light emitting display device may further include a spacer disposed between the pixel defining layer and the common layer.

In an embodiment, the discharging hole may extend through the common layer and into the spacer.

In an embodiment, the discharging hole may extend through the common layer, the spacer, and into the pixel defining layer.

In an embodiment, a width of the spacer may be less than a width of the pixel defining layer.

In an embodiment, the discharging hole may be spaced apart from an edge of the spacer by at least about 3 micrometers (μm).

In an embodiment, a width of the discharging hole may be in a range from about 1 micrometer (μm) to about 100 μm.

In an embodiment, each of the planarization layer and the pixel defining layer may each include an organic material.

In an embodiment, the organic light emitting display device may further include a light emitting layer disposed on the pixel electrode. The common layer may include a common electrode disposed on the light emitting layer.

In an embodiment, the common layer may further include a first function layer disposed between the pixel electrode and the light emitting layer and a second function layer disposed between the light emitting layer and the common electrode.

In an embodiment, the common layer may further include a capping layer disposed between the common electrode and the encapsulation substrate.

In an embodiment, the organic light emitting display device may further include a thin film transistor disposed on the base substrate. The planarization layer may cover the thin film transistor.

A method of manufacturing an organic light emitting display device includes providing an encapsulation substrate on a base substrate including an emission area at which light is emitted and a peripheral area which is adjacent to the emission area; providing a common layer between the base substrate and the encapsulation substrate, the common layer disposed in both the emission area and the peripheral area; providing between the base substrate and the common layer, each of: a planarization layer; a pixel electrode in the emission area; and a pixel defining layer; and providing a discharging hole corresponding to the pixel defining layer, the discharging hole extending through the common layer.

In an embodiment, the discharging hole may be formed by a laser drilling process which irradiates the common layer with a laser beam.

In an embodiment, a depth of the discharging hole may increase as an intensity of the laser beam increases.

In an embodiment, a width of the discharging hole may increase as a width of the laser beam increases.

In an embodiment, the method may further include providing a spacer between the pixel defining layer and the common layer.

In an embodiment, the discharging hole may extend through the common layer and into the spacer.

In an embodiment, the discharging hole may extend through the common layer, the spacer, and into the pixel defining layer.

In an embodiment, the pixel defining layer at a location corresponding to the discharging hole extends toward the encapsulation substrate to define the spacer.

In the organic light emitting display device according to one or more embodiment, the discharging hole overlapping the pixel defining layer and extending through at least the common layer may be provided corresponding to the planarization layer including the organic material. Accordingly, gases emitted from the planarization layer may be discharged through the discharging hole, and pixel shrinkage due to the gases may be delayed or substantially prevented.

In the method of manufacturing the display device according to one or more embodiment, the discharging hole overlapping the pixel defining layer and extending through at least the common layer may be provided corresponding to the planarization layer by the laser drilling process. Therefore, gases emitted from the planarization layer may be discharged through the discharging hole, and pixel shrinkage due to the gases may be delayed or substantially prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
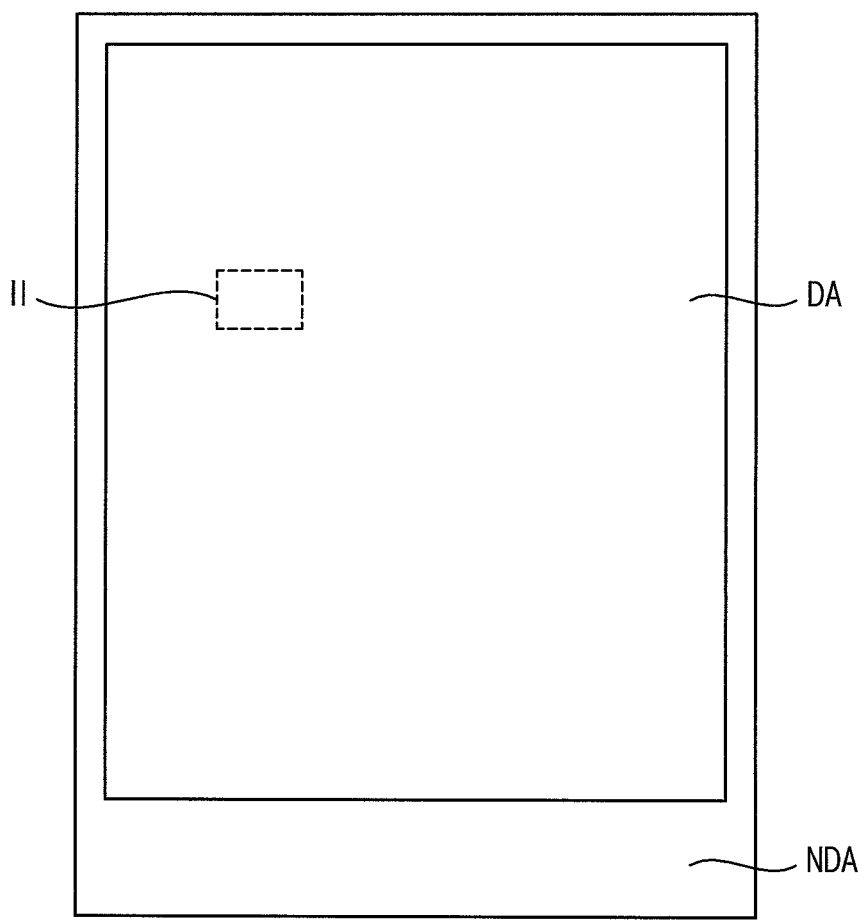
FIG. 1 is a top plan view illustrating an embodiment of an organic light emitting display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, organic light emitting display devices and methods of manufacturing organic light emitting display devices in accordance with embodiments will be explained in detail with reference to the accompanying drawings.

Hereinafter, an organic light emitting display device will be described with reference to FIGS. 1 to 6.

FIG. 1 is a top plan view illustrating an embodiment of an organic light emitting display device.

Referring to FIG. 1, an organic light emitting display device may include a display area DA and a non-display area NDA. A plurality of pixels may be disposed in the display area DA. An image may be displayed at the display area DA. Light may be emitted at the pixel in the display area DA to display the image. The image may be displayed with a combination of light emitted from the pixels.

The non-display area NDA may be adjacent to the display area DA. In an embodiment, for example, the non-display area NDA may substantially surround the display area DA. Drivers for transmitting driving signals, power signals, etc. to the pixels and conductive signal and/or conductive power lines may be disposed in the non-display area NDA.

Figure 2:
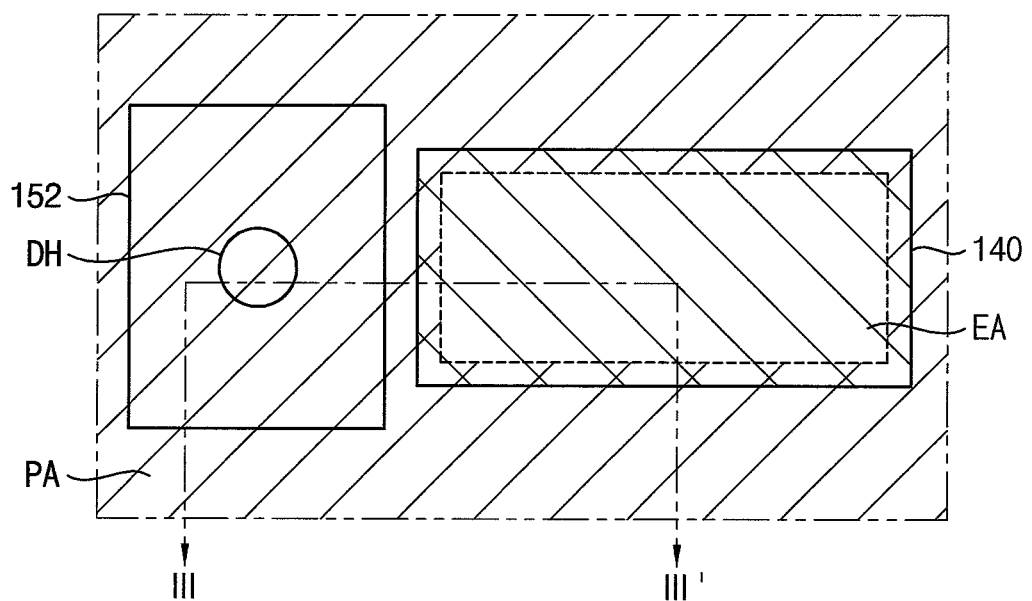
FIG. 2 is an enlarged top plan view illustrating an embodiment of a portion of a display area of the organic light emitting display device in FIG. 1.
Figure 3:
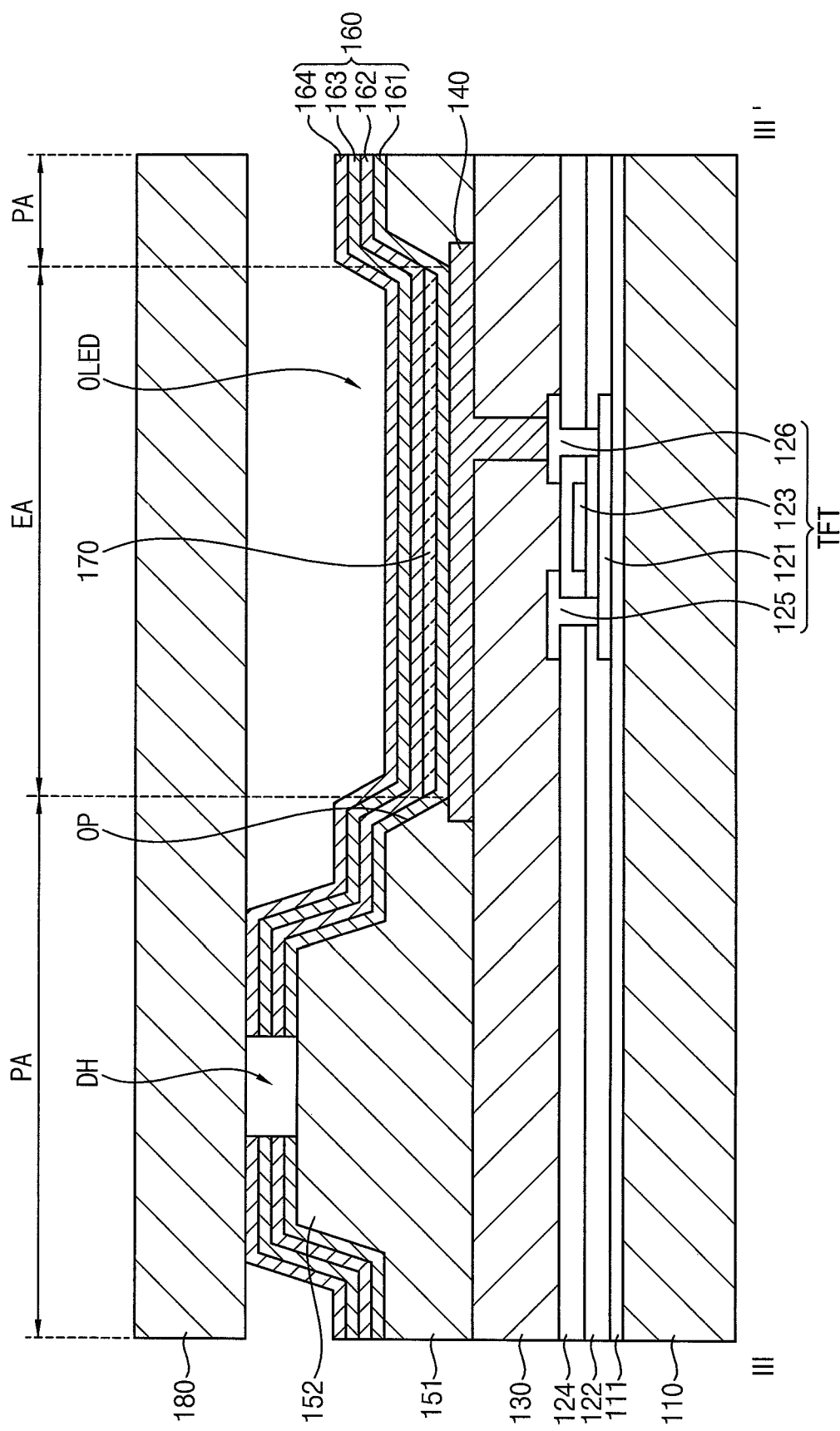
FIG. 3 is a cross-sectional view illustrating an embodiment of the organic light emitting display device in FIG. 1 taken along line in FIG. 2.

FIG. 2 is an enlarged top plan view illustrating an embodiment of a portion of the display area DA of the organic light emitting display device in FIG. 1. FIG. 3 is a cross-sectional view illustrating an embodiment of the organic light emitting display device in FIG. 1. FIG. 2 is an enlarged top plan view of an area II in FIG. 1, and FIG. 3 is a cross-sectional view taken along line in FIG. 2.

The organic light emitting display device and components thereof may be disposed in a plane defined by a first direction and a second direction which crosses the first direction. In FIG. 1, the vertical direction and the horizontal direction may variously represent the first direction and the second direction. A thickness of the organic light emitting display device and the components thereof may extend along a third direction which crosses each of the first direction and the second direction. In FIG. 3, the vertical direction represents the third direction, while the horizontal direction represents the first direction and/or the second direction. As used herein, a thickness of a layer or element may be a maximum dimension thereof along the third direction or along a normal direction to surface defining a profile along which the layer or element extends.

Referring to FIGS. 2 and 3, the organic light emitting display device may include a base substrate 110, a thin film transistor TFT, a planarization layer 130, an organic light emitting diode OLED, a pixel defining layer 151, a spacer 152, a capping layer 164, and an encapsulation substrate 180.

The base substrate 110 may include glass, quartz, plastic, etc.

A buffer layer 111 may be disposed on the base substrate 110. The buffer layer 111 may block impurities such as moisture, oxygen, etc. that permeate through the base substrate 110. The buffer layer 111 may provide a planarized surface on which other components are provided. The buffer layer 111 may include an inorganic material such as silicon oxide, silicon nitride, etc. Alternatively, the buffer layer 111 may be omitted.

The thin film transistor TFT may be disposed on the base substrate 110. The thin film transistor TFT may include an active pattern 121, a gate electrode 123, a source electrode 125, and a drain electrode 126. The thin film transistor TFT may provide an electrical driving current to the organic light emitting diode OLED based on a driving signal.

The active pattern 121 may be disposed on the buffer layer 111. The active pattern 121 may include amorphous silicon, polysilicon, an oxide semiconductor, an organic semiconductor, or the like. The active pattern 121 may include a channel region, and a source region and a drain region spaced apart from each other with the channel region in between.

A gate insulation layer 122 covering the active pattern 121 may be disposed on the buffer layer 111. The gate insulation layer 122 may be disposed between the active pattern 121 and the gate electrode 123, and may insulate the gate electrode 123 from the active pattern 121. The gate insulation layer 122 may include an inorganic material such as silicon oxide, silicon nitride, etc.

The gate electrode 123 may be disposed on the gate insulation layer 122. The gate electrode 123 may overlap a portion of the active pattern 121. In an embodiment, for example, the gate electrode 123 may overlap the channel region of the active pattern 121. The gate electrode 123 may include a metal material such as gold (Au), silver (Ag), copper (Cu), nickel (Ni), platinum (Pt), palladium (Pd), aluminum (Al), molybdenum (Mo), titanium, (Ti), etc.

An insulation interlayer 124 covering the gate electrode 123 may be disposed on the gate insulation layer 122. The insulation interlayer 124 may be disposed between the gate electrode 123 and the source electrode 125 and between the gate electrode 123 and the drain electrode 126, and may insulate the source electrode 125 and the drain electrode 126 from the gate electrode 123, respectively. The insulation interlayer 124 may include an inorganic material such as silicon oxide, silicon nitride, etc.

The source electrode 125 and the drain electrode 126 may be disposed on the insulation interlayer 124. The source electrode 125 and the drain electrode 126 may be electrically connected to the active pattern 121. In an embodiment, for example, the source electrode 125 and the drain electrode 126 may be in contact with the source region and the drain region of the active pattern 121, respectively, through contact holes defined in the gate insulation layer 122 and the insulation interlayer 124. Each of the source electrode 125 and the drain electrode 126 may include a metal material such as gold (Au), silver (Ag), copper (Cu), nickel (Ni), platinum (Pt), palladium (Pd), aluminum (Al), molybdenum (Mo), titanium, (Ti), etc.

The planarization layer 130 covering the source electrode 125 and the drain electrode 126 may be disposed on the insulation interlayer 124. The planarization layer 130 may cover the thin film transistor TFT, and may provide a planarized surface over the thin film transistor TFT. The planarization layer 130 may include an organic material. In an embodiment, for example, a thickness of the planarization layer 130 may be about 1.5 micrometers (μm).

The organic light emitting diode OLED may be disposed on the planarization layer 130. The organic light emitting diode OLED may include a pixel electrode 140, a first function layer 161, a light emitting layer 170, a second function layer 162, and a common electrode 163. The organic light emitting diode OLED may emit light based on the electrical driving current provided by the thin film transistor TFT.

The pixel electrode 140 may be disposed on the planarization layer 130. The pixel electrode 140 may be patterned for each pixel among the plurality of pixels. That is, the pixel electrode 140 may have a discrete planar shape corresponding to the each pixel. The pixel electrode 140 may be electrically connected to the source electrode 125 or the drain electrode 126. In an embodiment, for example, the pixel electrode 140 may be in contact with the drain electrode 126 through a contact hole defined in the planarization layer 130.

In an embodiment, the pixel electrode 140 may be a reflective electrode. The pixel electrode 140 may include a reflective layer including a material which reflects light, such as silver (Ag), magnesium (Mg), aluminum (Al), platinum (Pt), palladium (Pd), gold (Au), nickel (Ni), neodymium (Nd), iridium (Ir), chromium (Cr), etc. and a transmitting layer including a material through which light is transmittable, such as indium tin oxide ("ITO"), indium zinc oxide ("IZO"), zinc oxide ("ZnO"), indium oxide ($In_2O_3$), etc. In an embodiment, for example, the pixel electrode 140 may have a multilayer structure such as ITO/Ag/ITO.

The pixel defining layer 151 partially covering the pixel electrode 140 may be disposed on the planarization layer 130. In an embodiment, for example, the pixel defining layer 151 may cover an edge of the pixel electrode 140, and may include or define an opening that exposes a center portion of the pixel electrode 140. An emission area EA at which light is emitted from the pixel may be defined by the opening OP of the pixel defining layer 151 that exposes the center portion of the pixel electrode 140. A portion of the pixel which is outside the emission area EA and in which the pixel defining layer 151 is disposed may be defined as a peripheral area PA. The pixel defining layer 151 may include an organic material. In an embodiment, for example, a thickness of the pixel defining layer 151 may be about 1.5 μm.

The spacer 152 may be disposed on the pixel defining layer 151. The spacer 152 may be disposed on the pixel defining layer 151 in the peripheral area PA. In a same direction along the base substrate 110, a width of the spacer 152 may be less than a width of the pixel defining layer 151. The widths of the spacer 152 and the pixel defining layer 151 may be maximum dimensions thereof in the same direction along the base substrate 110, without being limited thereto. The spacer 152 may support the encapsulation substrate 180, and may separate the encapsulation substrate 180 from the organic light emitting diode OLED along a thickness direction to protect the organic light emitting diode OLED. The spacer 152 may include an organic material. In an embodiment, for example, a thickness of the spacer 152 may be about 1.5 μm.

Referring to FIG. 3, for example, a virtual upper surface of the pixel defining layer 151 may be defined between points where sidewalls of the spacer 152 meet the pixel defining layer 151. A thickness of the spacer 152 may be defined from the virtual upper surface of the pixel defining layer 151, without being limited thereto. The width of the spacer 152 may be a maximum distance defined between the points.

In an embodiment, the spacer 152 may be integrally formed with the pixel defining layer 151. Referring to FIG. 3, for example, the pixel defining layer 151 at a location corresponding to the discharging hole DH extends toward the encapsulation substrate 180 to define the spacer 152 as a protruded portion of the pixel defining layer 151. A portion of the pixel defining layer 151 having a maximum thickness may define the spacer 152, without being limited thereto. In an alternative embodiment, the spacer 152 may be formed separately from the pixel defining layer 151, such as to be respective portions of two different layers among layers disposed on the base substrate 110.

In an embodiment, the spacer 152 may have a quadrangular shape in a top plan view. However, a planar shape of the spacer 152 is not limited thereto, and the spacer 152 may include other polygonal planar shapes outside the quadrangular shape.

The first function layer 161 may be disposed on the pixel electrode 140, the pixel defining layer 151, and the spacer 152. The first function layer 161 may be commonly provided for each pixel among the plurality of pixels. The first function layer 161 may include a hole injection layer and/or a hole transport layer. In an embodiment, the first function layer 161 may further include at least one of a buffer layer and an electron blocking layer. In an embodiment, for example, a thickness of the first function layer 161 may be about 1130 angstroms (Å).

The first function layer 161 may have a single-layer structure including or formed of a single material, a single-layer structure including or formed of a plurality of different materials, or a multilayer structure including or formed of a plurality of different materials. In an embodiment, for example, the first function layer 161 may have a single-layer structure including formed of a plurality of different materials, or may have a multilayer structure in which a hole injection layer and a hole transport layer, a hole injecting layer, a hole transport layer and a buffer layer, a hole injection layer and a buffer layer, a hole transport layer and a buffer layer, or a hole injection layer, a hole transport layer and an electron blocking layer are sequentially stacked on the pixel electrode 140. However, the first function layer 161 is not limited to the aforementioned structures.

The light emitting layer 170 may be disposed on the first function layer 161. The light emitting layer 170 may be disposed in the opening OP of the pixel defining layer 151. The light emitting layer 170 have a single-layer structure or a multilayer structure including a plurality of layers. In an embodiment, for example, a thickness of the light emitting layer 170 may be in a range from about 100 Å to about 1500 Å.

The second function layer 162 may be disposed on the light emitting layer 170 and the first function layer 161. The second function layer 162 may be commonly provided for each pixel among the plurality of pixels. The second function layer 162 may include at least one of a hole blocking layer, an electron transport layer, and an electron injection layer. In an embodiment, for example, the second function layer 162 may have may have a multilayer structure in which an electron transport layer and an electron injection layer, or a hole blocking layer, an electron transport layer and an electron injection layer are sequentially stacked on the light emitting layer 170, or a single-layer structure including or formed of a combination of the aforementioned layers. However, the second function layer 162 is not limited to the aforementioned structures. In an embodiment, for example, a thickness of the second function layer 162 may be about 500 Å.

The common electrode 163 may be disposed on the second function layer 162. The common electrode 163 may be commonly provided for each pixel among the plurality of pixels. The common electrode 163 may be a transmitting electrode. In an embodiment, for example, the common electrode 163 may include or be formed of a metal material, a metal alloy, a metal nitride, a conductive metal oxide, transparent conductive material, or the like. In an embodiment, for example, a thickness of the common electrode 163 may be in a range from about 90 Å to about 100 Å.

The capping layer 164 may be disposed on the common electrode 163. The capping layer 164 may be commonly provided for each pixel among the plurality of pixels. The capping layer 164 may protect the organic light emitting diode OLED, and may improve efficiency of light emitted from the light emitting layer 170. In an embodiment, for example, the capping layer 164 may include or be formed of an inorganic layer, an organic layer, or an organic layer including inorganic particles. In an embodiment, for example, a thickness of the capping layer 164 may be in a range from about 700 Å to about 800 Å.

The first function layer 161, the second function layer 162, the common electrode 163, and the capping layer 164 provided formed on and along a respective profile of the pixel electrode 140, the pixel defining layer 151, and the spacer 152 may together constitute a common layer 160. The common layer 160 may be provided or formed throughout the emission area EA and the peripheral area PA, to be commonly disposed therein.

A discharging hole DH extended through at least the common layer 160 may be defined or formed on the planarization layer 130. The discharging hole DH may overlap the pixel defining layer 151 and the spacer 152.

When light or heat is supplied to the planarization layer 130, the pixel defining layer 151 and/or the spacer 152 including organic materials, the organic materials may be decomposed by the light or heat thereby generating gases. When the gases are diffused and supplied to the organic light emitting diode OLED, the light emitting layer 170 may be degraded, and pixel shrinkage in which a size of the emission area EA decreases may occur.

However, according to one or more embodiment, the discharging hole DH extended through at least the common layer 160 may be defined or formed on the planarization layer 130, so that the gases may be discharged out of the organic light emitting display device through the discharging hole DH. Accordingly, the pixel shrinkage may be delayed or substantially prevented.

The discharging hole DH exposes a portion of one or more of a plurality of organic material layers between the common layer 160 and the base substrate 110, to outside the common layer 160. The gases may be discharged out of the organic light emitting display device at the portion of the one or more of the plurality of organic material layers between the common layer 160 and the base substrate 110. Referring to FIG. 3, for example, an upper surface of the pixel defining layer 151 is exposed to outside of the common layer 160, and gases may be discharged out of the organic light emitting display device through the upper surface of the pixel defining layer 151 which is exposed at the discharging hole DH.

Figure 4:
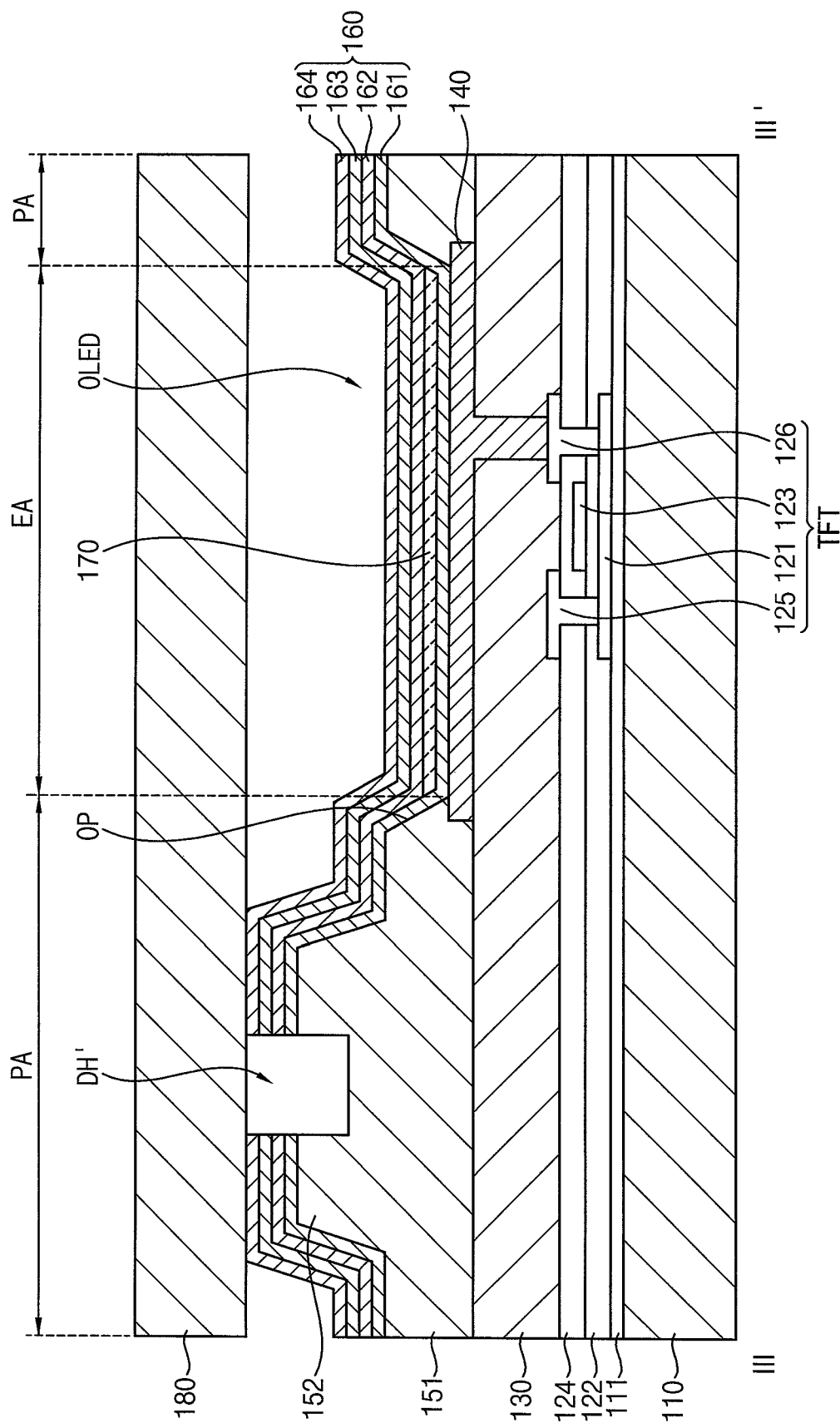
FIGS. 4, 5, and 6 are cross-sectional views illustrating other embodiment of the organic light emitting display device in FIG. 1 taken along line in FIG. 2.
Figure 5:
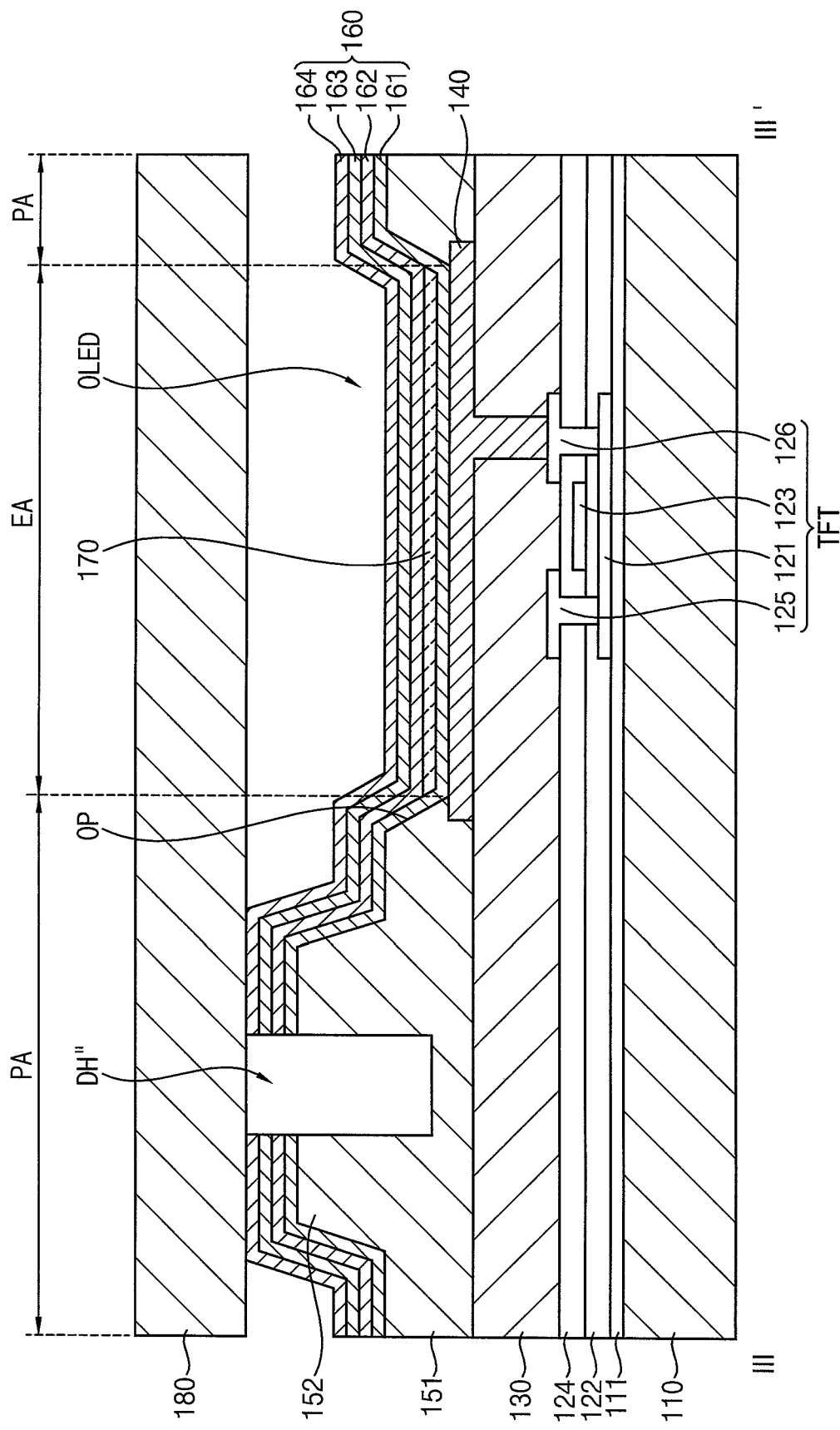
Figure 6:
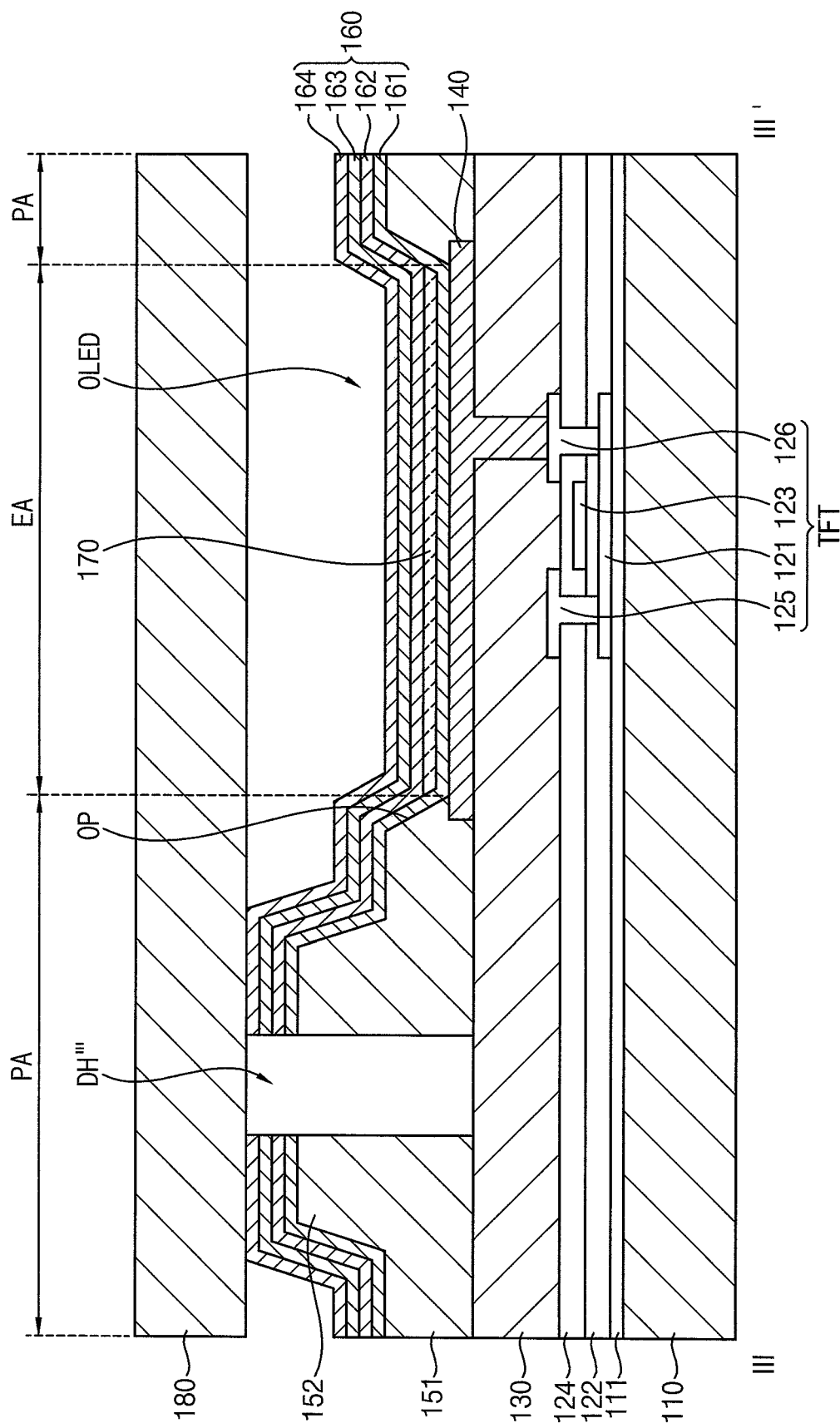

FIGS. 4, 5, and 6 are cross-sectional views illustrating other embodiments of the organic light emitting display device in FIG. 1. FIGS. 4, 5, and 6 are each be cross-sectional views taken along line in FIG. 2.

In an embodiment, the discharging hole DH may extend through only the common layer 160 disposed on the spacer 152 as illustrated in FIG. 3. In an embodiment, a same one of the discharging hole DH' may extend completely through the common layer 160 and further extend into the spacer 152 as illustrated in FIG. 4. In an embodiment, a same one of the discharging hole DH" may extend completely through the common layer 160 and the spacer 152, and further extend into the pixel defining layer 151 as illustrated in FIG. 5. In an embodiment, a same one of the discharging hole DH" may extend completely through an entirety of the thicknesses of each of the common layer 160, the spacer 152, and the pixel defining layer 151 as illustrated in FIG. 6.

Accordingly, a depth of the discharging hole DH along the thickness of the organic light emitting display device may be greater than or equal to a thickness of the common layer 160, and less than or equal to a total sum of a thickness of the common layer 160, a thickness of the spacer 152, and a thickness of the pixel defining layer 151. In an embodiment, for example, the depth of the discharging hole DH may be in a range from about 2420 Å to about 47530 Å.

In an embodiment, a width of the discharging hole DH may be in a range from about 1 μm to about 100 μm. The width of the discharging hole DH may be a maximum dimension thereof along the base substrate 110, without being limited thereto. The discharging hole DH may be defined inside a planar shape of the spacer 152, to be spaced apart from an outer edge of the spacer 152 by about 3 μm in a top plan view, in consideration of a process margin for a method of manufacturing an organic light emitting display device.

In an embodiment, the discharging hole DH may have a substantial circle planar shape in a top plan view. However, the planar shape of the discharging hole DH is not limited thereto, and the discharging hole DH may have a polygonal planar shape such as a quadrangular shape.

The encapsulation substrate 180 may be disposed on the capping layer 164. The encapsulation substrate 180 may include glass, quartz, plastic, etc.

The discharging hole DH may be an enclosed space. An inside of the discharging hole DH surrounded by the common layer 160, the encapsulation substrate 180, the spacer 152, etc. may be in a vacuum state. When gases are generated from the planarization layer 130, the pixel defining layer 151 and/or the spacer 152 which are at atmospheric pressure, the gases may be diffused into the discharging hole DH that is in the vacuum state. Accordingly, an infiltration of the gases into the organic light emitting diode OLED may be reduced or effectively prevented.

Hereinafter, an embodiment of a method of manufacturing an organic light emitting display device will be described with reference to FIGS. 7 to 13.

FIGS. 7, 8, 9, 10, 11, 12, and 13 are cross-sectional views illustrating an embodiment of a method of manufacturing an organic light emitting display device.

Figure 7:
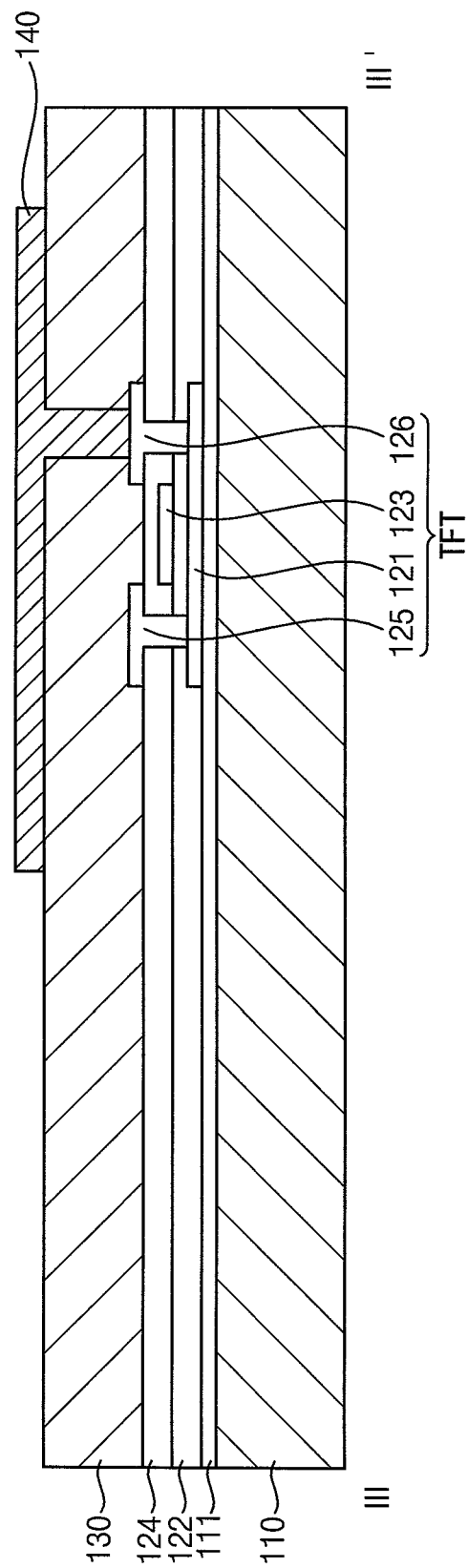
FIGS. 7, 8, 9, 10, 11, 12, and 13 are cross-sectional views illustrating an embodiment of a method of manufacturing an organic light emitting display device.

Referring to FIG. 7, the planarization layer 130 covering the thin film transistor TFT may be provided or formed on the base substrate 110, and the pixel electrode 140 may be provided or formed on the planarization layer 130.

The buffer layer 111 may be provided or formed on the base substrate 110. In an embodiment, for example, inorganic material including silicon oxide, silicon nitride, etc. may be deposited by chemical vapor deposition ("CVD"), sputtering, or the like to provide or form the buffer layer 111.

The thin film transistor TFT may be provided or formed on the buffer layer 111. In an embodiment, for example, amorphous silicon may be deposited on the buffer layer 111 by CVD, sputtering, or the like to provide or form an amorphous silicon layer, and the amorphous silicon layer may be partially etched to provide or form an amorphous silicon pattern. Then, the amorphous silicon pattern may be crystallized to provide or form a polysilicon pattern.

The gate insulation layer 122 covering the polysilicon pattern may be provided or formed on the buffer layer 111. In an embodiment, for example, inorganic material including silicon oxide, silicon nitride, etc. may be deposited by CVD, sputtering, or the like to provide or form the gate insulation layer 122.

The gate electrode 123 may be provided or formed on the gate insulation layer 122. In an embodiment, for example, metal such as gold (Au), silver (Ag), copper (Cu), nickel (Ni), platinum (Pt), palladium (Pd), aluminum (Al), molybdenum (Mo), titanium, (Ti), etc. may be deposited by CVD, sputtering, or the like to provide or form a metal layer, and the metal layer may be partially etched to provide or form the gate electrode 123.

Impurities may be injected to the polysilicon pattern to provide or form the active pattern 121. In an embodiment, for example, ions may be doped at opposite ends of the polysilicon pattern using the gate electrode 123 as a mask to provide or form the active pattern 121 including the source region, the drain region, and the channel region provided or formed therebetween.

The insulation interlayer 124 covering the gate electrode 123 may be provided or formed on the gate insulation layer 122. In an embodiment, for example, inorganic material including silicon oxide, silicon nitride, etc. may be deposited by CVD, sputtering, or the like to provide or form the insulation interlayer 124.

Contact holes may be provided or formed in the gate insulation layer 122 and the insulation interlayer 124. In an embodiment, for example, the contact holes may be provided or formed at portions of the gate insulation layer 122 and the insulation interlayer 124 respectively corresponding to the source region and the drain region of the active pattern 121 by photolithography, etc.

The source electrode 125 and the drain electrode 126 may be provided or formed on the insulation interlayer 124. In an embodiment, for example, metal such as gold (Au), silver (Ag), copper (Cu), nickel (Ni), platinum (Pt), palladium (Pd), aluminum (Al), molybdenum (Mo), titanium, (Ti), etc. may be deposited by CVD, sputtering, or the like to provide or form a metal layer filling the contact holes, and the metal layer may be partially etched to provide or form the source electrode 125 and the drain electrode 126. The source electrode 125 and the drain electrode 126 may correspond to the source region and the drain region of the active pattern 121.

The planarization layer 130 covering the source electrode 125 and the drain electrode 126 may be provided or formed on the insulation interlayer 124. In an embodiment, for example, organic material may be deposited by CVD, sputtering, or the like to provide or form the planarization layer 130. In an embodiment, for example, the planarization layer 130 may be provided or formed with a thickness of about 1.5 μm.

A contact hole may be provided or formed in the planarization layer 130. In an embodiment, for example, the contact hole may be provided or formed by photolithography, etc. at a portion of the planarization layer 130 corresponding to the source electrode 125 and/or the drain electrode 126.

The pixel electrode 140 may be provided or formed on the planarization layer 130. In an embodiment, for example, metal such as silver (Ag), magnesium (Mg), aluminum (Al), platinum (Pt), palladium (Pd), gold (Au), nickel (Ni), neodymium (Nd), iridium (Ir), chromium (Cr), etc. and a transparent conductive oxide such as indium tin oxide ("ITO"), indium zinc oxide ("IZO"), zinc oxide (ZnO), indium oxide ($In_2O_3$), etc. may be deposited by CVD, sputtering, or the like to provide or form a conductive layer filling the contact hole in the planarization layer 130, and the conductive layer may be partially etched to provide or form the pixel electrode 140.

Figure 8:
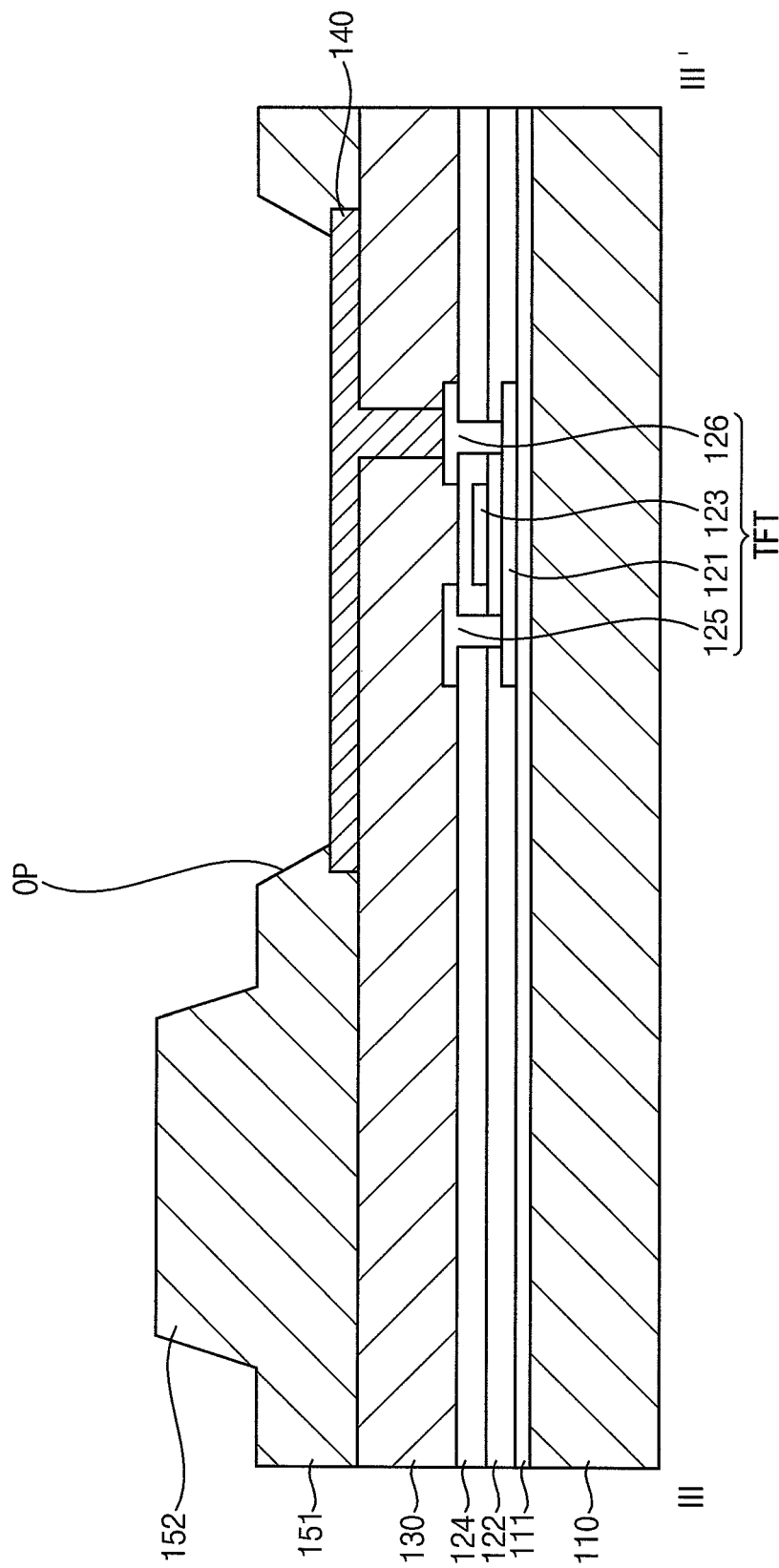

Referring to FIG. 8, the pixel defining layer 151 covering an edge of the pixel electrode 140 may be provided or formed on the planarization layer 130, and the spacer 152 may be provided or formed on the pixel defining layer 151.

In an embodiment, the pixel defining layer 151 and the spacer 152 may be integrally provided or formed. In an embodiment, for example, organic material may be deposited by CVD, sputtering, or the like to provide or form an organic layer, and the organic layer may be partially etched to provide or form the pixel defining layer 151 and the spacer 152. The organic layer may be exposed and cured by photolithography using a half-tone mask, so that the pixel defining layer 151 including the opening OP and the spacer 152 may be substantially simultaneously (or concurrently) provided or formed. In an embodiment, for example, each of the pixel defining layer 151 and the spacer 152 may be provided or formed with a thickness of about 1.5 μm. A total thickness of the pixel defining layer 151 and the spacer 152 may be about two times 1.5 μm without being limited thereto.

In an embodiment, the pixel defining layer 151 and the spacer 152 may be independently provided or formed. In an embodiment, for example, a first organic layer may be provided or formed, and the opening OP may be provided or formed in the first organic layer to provide or form the pixel defining layer 151. The pixel defining layer 151 excluding the spacer 152 may be provided or formed with a thickness of about 1.5 μm. A second organic layer may be provided or formed on the pixel defining layer 151 protruding from an upper surface thereof, and the second organic layer may be partially etched to provide or form the spacer 152. The spacer 152 excluding the pixel defining layer 151 may be provided or formed with a thickness of about 1.5 μm.

Figure 9:
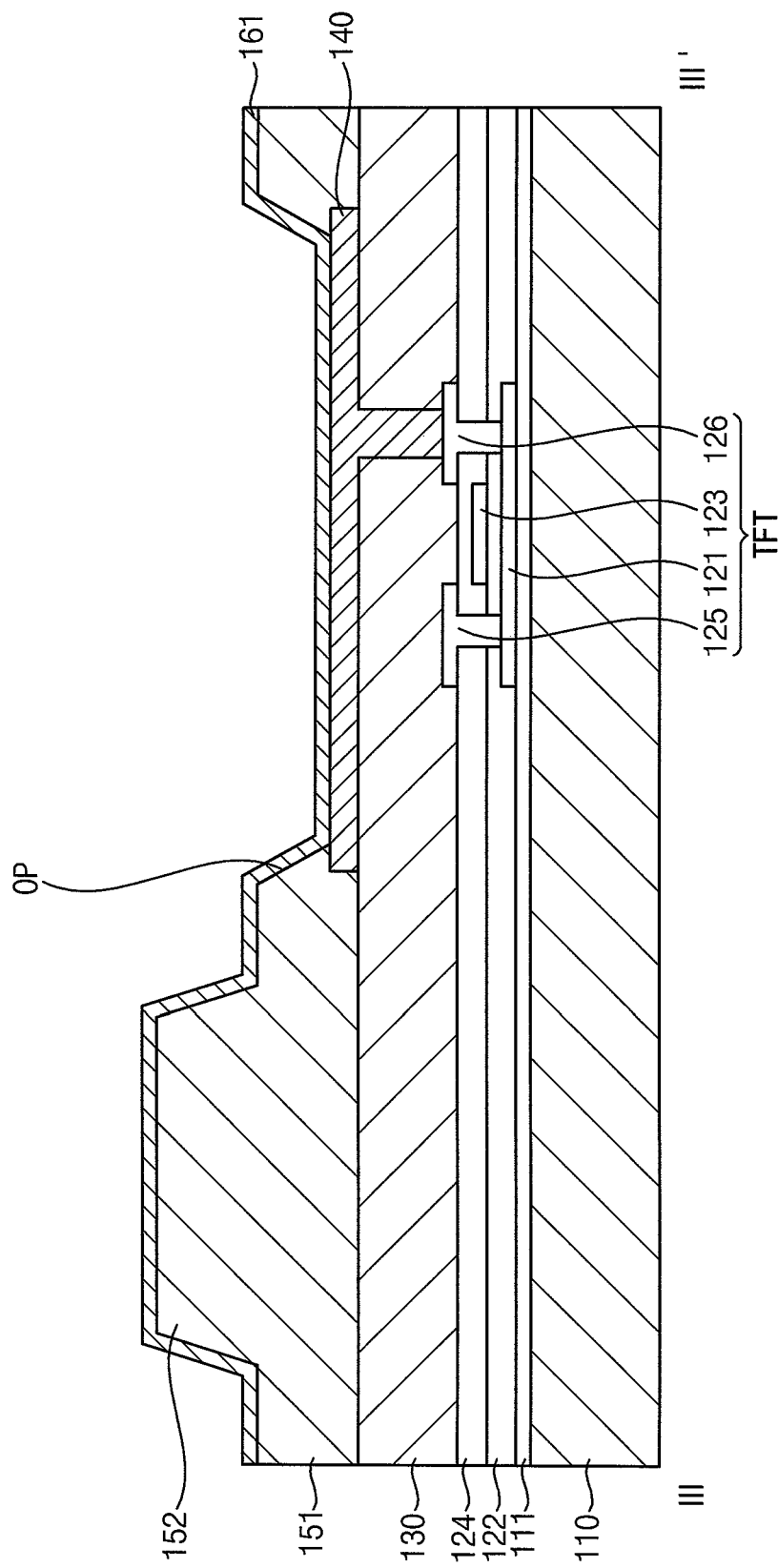

Referring to FIG. 9, the first function layer 161 may be provided or formed on the pixel electrode 140, the pixel defining layer 151, and the spacer 152.

The first function layer 161 may be provided or formed on and along a profile of each of the pixel electrode 140, the pixel defining layer 151, and the spacer 152. In an embodiment, for example, the first function layer 161 may be provided or formed using various methods such as vacuum deposition, spin coating, cast, Langmuir-Blodgett ("LB"), inkjet printing, laser printing, laser induced thermal imaging ("LITI"), etc. In an embodiment, for example, the first function layer 161 may be provided or formed with a thickness of about 1130 Å.

Figure 10:
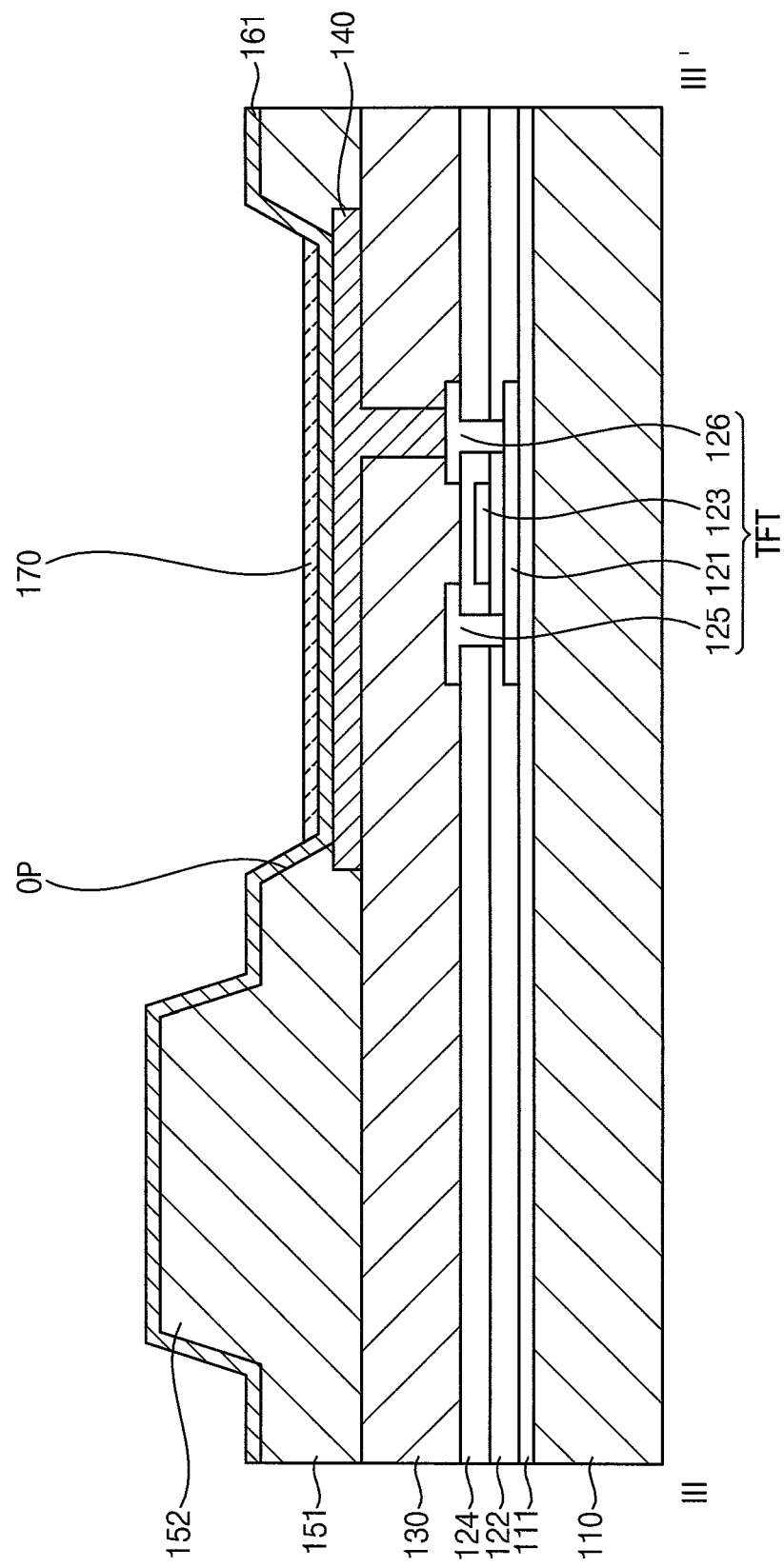

Referring to FIG. 10, the light emitting layer 170 may be provided or formed on the first function layer 161.

The light emitting layer 170 may be provided or formed in the opening OP of the pixel defining layer 151. In an embodiment, for example, the light emitting layer 170 may be provided or formed using various methods such as vacuum deposition, spin coating, cast, LB, inkjet printing, laser printing, LITI, etc. In an embodiment, for example, the light emitting layer 170 may be provided or formed with a thickness from about 100 Å to about 1500 Å.

Figure 11:
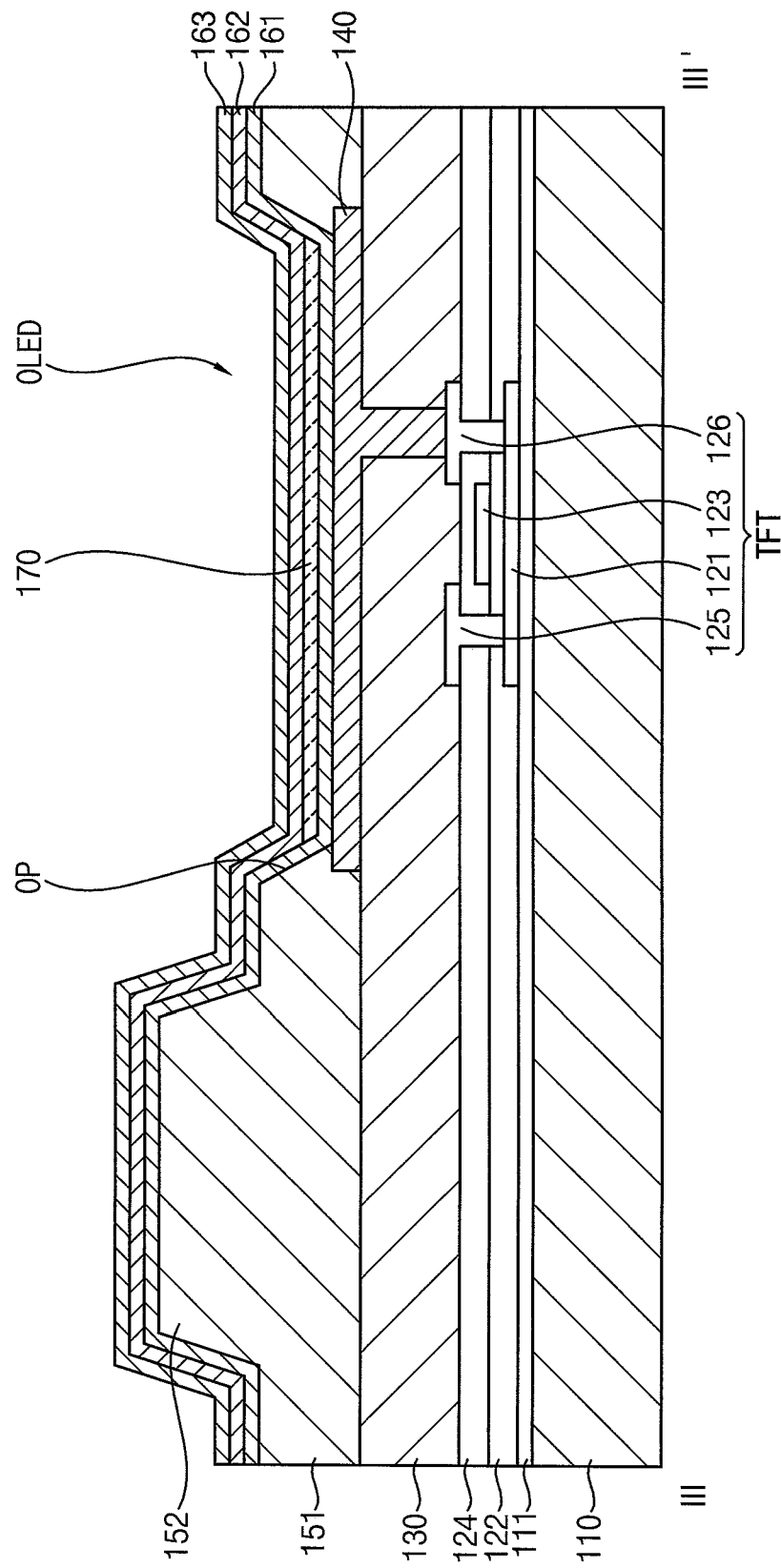

Referring to FIG. 11, the second function layer 162 may be provided or formed on the light emitting layer 170 and the first function layer 161, and the common electrode 163 may be provided or formed on the second function layer 162.

The second function layer 162 may be provided or formed on and along the light emitting layer 170 and the first function layer 161. In an embodiment, for example, the second function layer 162 may be provided or formed using various methods such as vacuum deposition, spin coating, cast, LB, inkjet printing, laser printing, LITI, etc. In an embodiment, for example, the second function layer 162 may be provided or formed with a thickness of about 500 Å.

The common electrode 163 may be provided or formed on and along a profile of the second function layer 162. In an embodiment, for example, a metal, a metal alloy, a metal nitride, a conductive metal oxide, transparent conductive material, or the like may be deposited by CVD, sputtering, or the like to provide or form the common electrode 163. In an embodiment, for example, the common electrode 163 may be provided or formed with a thickness from about 90 Å to about 100 Å.

The pixel electrode 140, the first function layer 161, the light emitting layer 170, the second function layer 162, the common electrode 163 provided or formed on the planarization layer 130 may together constitute the organic light emitting diode OLED.

Figure 12:
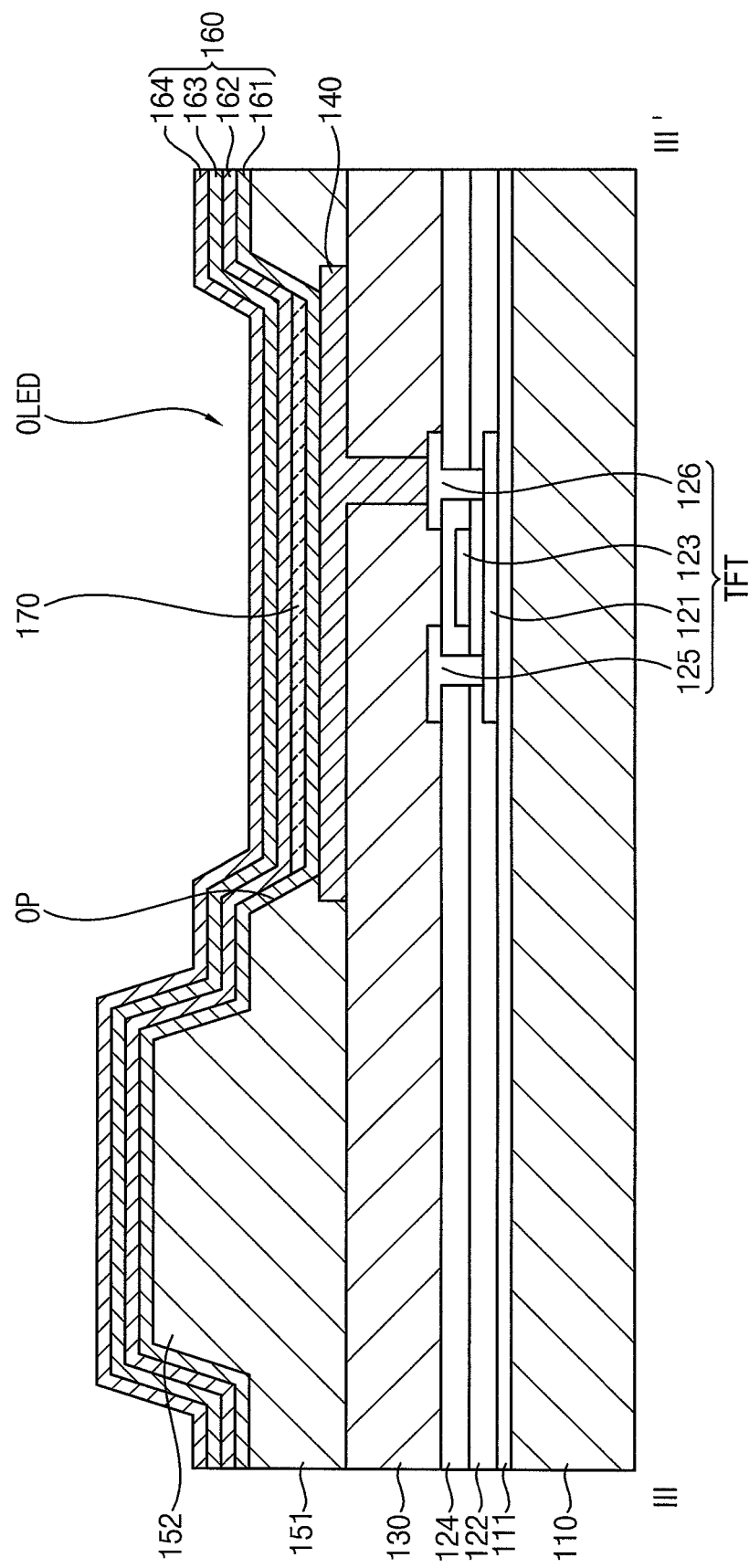

Referring to FIG. 12, the capping layer 164 may be provided or formed on the common electrode 163.

The capping layer 164 may be provided or formed on and along a profile of the common electrode 163. In an embodiment, for example, inorganic material, organic material, etc. may be deposited by CVD, sputtering, or the like to provide or form the capping layer 164. In an embodiment, for example, the capping layer 164 may be provided or formed with a thickness from about 700 Å to about 800 Å.

The first function layer 161, the second function layer 162, the common electrode 163, and the capping layer 164 provided or formed on and along the pixel electrode 140, the pixel defining layer 151, and the spacer 152 may constitute the common layer 160.

Figure 13:
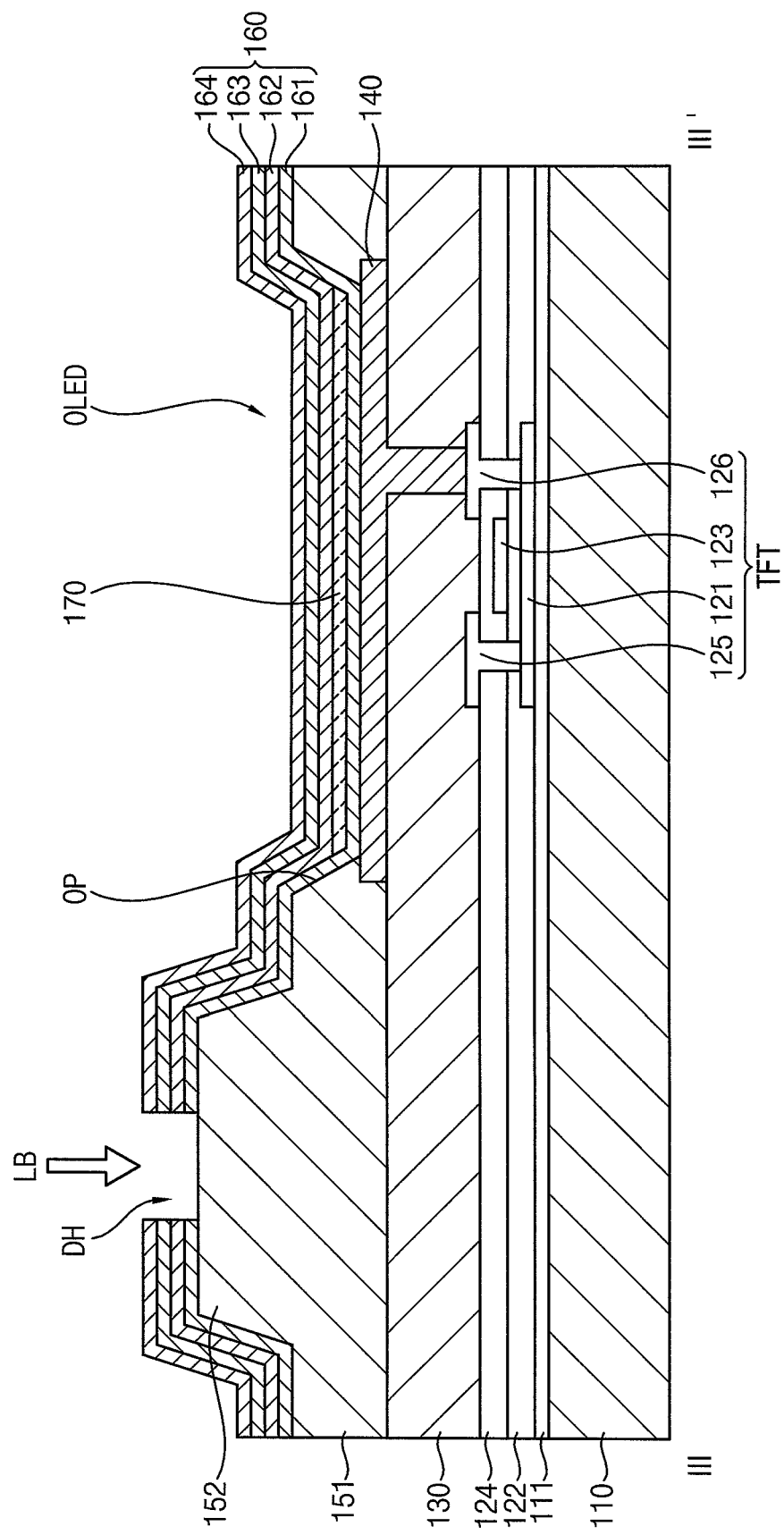

Referring to FIG. 13, the discharging hole DH extending through at least a thickness of the common layer 160 may be provided or formed overlapping the planarization layer 130. The discharging hole DH may be provided or formed at a portion of the planarization layer 130 corresponding to the pixel defining layer 151 and the spacer 152.

In an embodiment, the discharging hole DH may be provided or formed by a laser drilling process. Referring to FIG. 13, for example, the common layer 160 may be irradiated with a laser beam LB from a laser to provide or form the discharging hole DH. In an embodiment, for example, the laser may be disposed over the common layer 160, and the common layer 160 may be irradiated with the laser beam LB emitted from the laser to provide or form the discharging hole DH.

A depth of the discharging hole DH along a thickness of the organic light emitting display device may be controlled by an intensity of the laser beam LB. In an embodiment, for example, the depth of the discharging hole DH may be increased as the intensity of the laser beam LB increases, and the depth of the discharging hole DH may decreased as the intensity of the laser beam LB decreases.

In an embodiment, the common layer 160 may be irradiated with a laser beam LB having a first intensity to provide or form the discharging hole DH extending through a thickness of the common layer 160 (refer to FIG. 3). In an embodiment, the common layer 160 may be irradiated with a laser beam LB having a second intensity greater than the first intensity to provide or form the discharging hole DH extending completely through a thickness of the common layer 160 and at least a portion of a thickness of the spacer 152 (refer to FIG. 4). In an embodiment, the common layer 160 may be irradiated with a laser beam LB having a third intensity greater than the second intensity to provide or form the discharging hole DH extending completely through thicknesses of the common layer 160 and the spacer 152, and at least a portion of a thickness of the pixel defining layer 151 (refer to FIGS. 5 and 6).

A width of the discharging hole DH taken along the base substrate 110 may be controlled based on a width of a slit of the laser through which the laser beam LB passes. In an embodiment, for example, the width of the laser beam LB may increase as the width of the slit increases, and the width of the laser beam LB may decrease as the width of the slit decreases.

When the discharging hole DH is provided or formed using the laser beam LB, particles may be generated during an etching of the common layer 160, the spacer 152 and/or the pixel defining layer 151, and the particles may be absorbed by the common layer 160 thereby causing defects in the common layer 160.

To reduce or effectively prevent the defects in the common layer 160, in an embodiment, the base substrate 110 may be disposed to face down (e.g., along a gravitational direction), then, may be irradiated with the laser beam LB to provide or form the discharging hole DH. When the base substrate 110 faces down, the common layer 160 may be located under the base substrate 110 along the gravitational direction. In an embodiment, for example, the base substrate 110 may be rotated in a predetermined angle to face down, and the laser drilling process may be performed. With the common layer 160 located under the base substrate 110, the particles which are generated during an etching of the common layer 160 may be urged along the gravitational direction and away from the common layer 160 to reduce or effectively prevent absorbing of the particles thereby.

In an embodiment, the particles generating during the providing or the formation of the discharging hole DH may be absorbed using a particle absorption unit. In an embodiment, for example, the particle absorption unit may be disposed near a laser emitting unit which includes the laser for emitting the laser beam LB, and the particles may be removed using the particle absorption unit during the providing or the formation the of the discharging hole DH.

Referring again to FIG. 3, the encapsulation substrate 180 may be provided or formed on the common layer 160 provided or formed in FIG. 13, to manufacture the organic light emitting display device including layers of the base substrate 110 and the common layer 160, and all layers therebetween.

Air between the base substrate 110 and the encapsulation substrate 180 may be removed to maintain a space between the base substrate 110 and the encapsulation substrate 180 in a vacuum state. Therefore, as the various layers between the base substrate 110 and the encapsulation substrate 180 are provided or formed, especially the layers enclosing the discharging hole DH, an inside of the discharging hole DH may be in a vacuum state. When gases are generated from the planarization layer 130, the pixel defining layer 151 and/or the spacer 152 of the organic light emitting display device which are at atmospheric pressure for the organic light emitting display device which is finally manufactured, the gases may be diffused into the discharging hole DH that is in the vacuum state. Accordingly, an infiltration of the gases into the organic light emitting diode OLED for the organic light emitting display device which is finally manufactured may be reduced or effectively prevented.

The organic light emitting display device according to one or more embodiment may be applied to a display device included in a computer, a notebook, a mobile phone, a smartphone, a smart pad, a portable media player ("PMP"), a personal digital assistant ("PDA"), an MP3 player, or the like.

Although embodiments of the organic light emitting display devices and the methods of manufacturing the organic light emitting display devices have been described with reference to the drawings, the illustrated embodiments are examples, and may be modified and changed by a person having ordinary knowledge in the relevant technical field without departing from the technical spirit described in the following claims.

What is claimed is:

1. An organic light emitting display device, comprising:
a base substrate including an emission area at which light is emitted and a peripheral area which is adjacent to the emission area;
an encapsulation substrate disposed on the base substrate;
a common layer between the base substrate and the encapsulation substrate, the common layer disposed in both the emission area and the peripheral area;
between the base substrate and the common layer, each of:
a planarization layer;
a pixel electrode in the emission area; and
a pixel defining layer; and
a discharging hole disposed corresponding to the pixel defining layer, the discharging hole extending through the common layer,
wherein the discharging hole corresponding to the pixel defining layer extends through the common layer and the pixel defining layer, and exposes the planarization layer to outside the pixel defining layer and the common layer.

2. The organic light emitting display device of claim 1, further comprising: a spacer disposed between the pixel defining layer and the common layer.

3. The organic light emitting display device of claim 1, wherein the discharging hole corresponding to the pixel defining layer is in a vacuum state.

4. The organic light emitting display device of claim 2, wherein along a same direction, a width of the spacer is less than a width of the pixel defining layer.

5. The organic light emitting display device of claim 2, wherein the discharging hole corresponding to the pixel defining layer is spaced apart from an edge of the spacer by at least about 3 micrometers.

6. The organic light emitting display device of claim 1, wherein a width of the discharging hole corresponding to the pixel defining layer is in a range from about 1 micrometer to about 100 micrometers.

7. The organic light emitting display device of claim 1, wherein each of the planarization layer and the pixel defining layer includes an organic material.

8. The organic light emitting display device of claim 1, further comprising:
a light emitting layer disposed on the pixel electrode in the emission area,
wherein the common layer includes a common electrode overlapping the light emitting layer.

9. The organic light emitting display device of claim 8, wherein the common layer further includes a plurality of function layers with which the light is emitted at the emission area, the plurality of function layers comprising:
a first function layer disposed between the pixel electrode and the light emitting layer; and
a second function layer disposed between the light emitting layer and the common electrode.

10. The organic light emitting display device of claim 9, wherein the common layer further includes a capping layer between the common electrode and the encapsulation substrate.

11. The organic light emitting display device of claim 1, further comprising:
a thin film transistor disposed on the base substrate,
wherein the planarization layer covers the thin film transistor.

* * * * *